United States Patent [19]

Yoshida et al.

[11] 4,067,036

[45] Jan. 3, 1978

[54] JUNCTION FIELD EFFECT TRANSISTOR OF VERTICAL TYPE

[75] Inventors: Takashi Yoshida; Katsuhiko Ishida, both of Hamamatsu, Japan

[73] Assignee: Nippon Gakki Seizo Kabushiki Kaisha, Hamamatsu, Japan

[21] Appl. No.: 711,641

[22] Filed: Aug. 4, 1976

[30] Foreign Application Priority Data

Aug. 9, 1975 Japan .................................. 50-96843

[51] Int. Cl.$^2$ ...................... H01L 29/80; H01L 29/78
[52] U.S. Cl. ........................................ 357/22; 357/23
[58] Field of Search ................................... 357/22, 23

[56] References Cited

U.S. PATENT DOCUMENTS 3,767,982  10/1973  Teszner et al. .................. 357/22

*Primary Examiner*—Edward J. Wojciechowicz
*Attorney, Agent, or Firm*—Cushman, Darby & Cushman

[57] ABSTRACT

A junction field effect transistor of a vertical type having: a drain region having a first conductivity type; a gate region composed of branches formed on said drain region by a selective vapor deposition or liquidous phase deposition method and having a second conductivity type opposite to the first conductivity type of the drain region, at least that surface of each of the branches of the gate region which locates on the side opposite to the drain region side being covered with an insulating layer; and source regions formed between the respective branches of the gate region by conducting a further growth of said drain region. This field effect transistor has a sufficiently reduced area of P - N junction between the gate region and the respective source regions, resulting in a marked reduction in the junction capacitance. Besides, the insulated gate region with respect to the source regions give rise to a high gate-to-source breakdown voltage property.

6 Claims, 9 Drawing Figures

JUNCTION FIELD EFFECT TRANSISTOR OF VERTICAL TYPE

BACKGROUND OF THE INVENTION a. Field of the Invention

The present invention is concerned with a junction field effect transistor of a vertical type, especially it relates to an improved method of forming the gate region of the junction field effect transistor of a vertical type.

b. Description of the Prior Art

Researches are being conducted animatedly of late in general on the so-called vertical-type junction field effect transistors exhibiting an unsaturated characteristic (drain voltage versus drain current characteristic) resembling the characteristic of a triode vacuum tube. Under such situation, there have recently been proposed such junction field effect transistors (the words "Field effect tansistor" will hereinafter be abbreviated as FET) of a vertical Type as shown in FIG. 1 and such junction FET of a vertical type as shown in FIG. 2.

The known junction FET of a vertical type having an embedded gate construction as shown in FIG. 1 is prepared by the steps of: selectively difussing, for example, a highly concentrated P-type impurity into the drain region 10 made of an N-type semiconductor of a low impurity concentration from one surface thereof, to form a gate region 11 composed of grids; then forming, on top of the drain region 10 by a chemical vapor-deposition (growth) technique, a source region 12 composed of an N-type semiconductor of an impurity concentration not lower than that of the drain region 10 in such manner that this gate region 11 is substantially embedded between the drain region 10 and the source regions 12; and thereafter forming, on top of a gate region 11' by an etching technique or thermal diffusion technique, a gate electrode lead-out layer 14 of a low resistance connected to that gate region 11'.

Such a known junction FET of a vertical type having an embedded gate formation, however, has several problems that have to be solved. The gate region 11 is formed by diffusing, through the apertures of a mask, a required impurity into the drain region 10. However, this impurity spreads in horizontal as well as vertical directions through said apertures. This spreading of the impurity could result in an increase in the width as well as the depth of the gate grid 11. As a result, there arises the inconveniences that the respective channels 13 between the respective gate grids 11 are undesirably closed, and that the area of P-N junction between the gate region 11 and the source region 12 is increased, causing the junction capacitance to increase and also causing the upper limit level of the operating frequency or cut off frequency to become lowered. On the other hand, in order to heighten this upper limit level of the operating frequency, it is necessary to sufficiently enhance the impurity concentration of the gate grid 11 and thereby to reduce the series resistance at the gate region. In view of the nature of the diffusion technique which is applied, however, the local maximum impurity concentration of the gate region 11 tends to become markedly high when it is intended to elevate the mean impurity concentration. Therefore, crystal defect is apt to develop at the intersurface between the drain region 10 and the source region 12 which is formed on top of this drain region 10, especially at the sites adjacent to the gate regions 11. This development of crystal defect, in turn, increases reverse leakage and brings about a degradation of the breakdown voltage property.

Still further, the construction of the conventional junction FET of FIG. 1 having such an embedded gate structure as described above requires mask-forming steps of ordinarily more than five (5) stages, and therefore a considerable length of time is needed for the manufacture of such FET.

On the other hand, the known junction FET of a vertical type shown in FIG. 2 is prepared by a selective local oxidization of the surface of, for example, an N-type semiconductor substrate 20; then forming grooves at the oxidized site by digging down this site through an etching technique; thereafter forming a gate region 21 by diffusing a P-type impurity into the inner circumferential surfaces of these dug-out grooves; then oxidizing the resulting surfaces of the grooves to provide an oxidized region 22 while causing those portions of the diffused impurity located close to the surface of the substrate 20 to be absorbed substantially into the second-occurring oxidized region 22 to define a source region 23 between the respective oxidized regions 22; finally forming a gate electrode lead-out layer 24 to be connected to a desired gate region 21' formed for the sake of the gate electrode.

However, the known junction FET of vertical type having the gate region formed by digging down as shown in FIG. 2 also has several drawbacks to be solved. More particularly, since the gate region 21 is formed by "digging", this gate region 21 is located relatively close to the source electrode 23a which is provided on top of both source region 23 and the oxidized region 22. Accordingly, the produced FET has a low breakdown voltage property. Also, in the event that the aforesaid absorption of those portions of the impurity diffused into the dug-out groove which are located close to the surface of the source region 23 is not perfectly carried out, there will arise the inconvenience that the gate region 21 may locally contact the source electrode 23a, resulting in a contribution to the degradation of the breakdown voltage. Furthermore, in order to form such a junction FET having the dug-out gate formation as described above, there are required at least two manufacturing steps, i.e., selective oxidization and etching steps, causing the manufacturing process as a whole to become considerably complicated.

SUMMARY OF THE INVENTION

It is, therefore, a general object of the present invention to solve the aforesaid drawbacks of the known junction FET of a vertical type. A primary object of the present invention is to provide a junction FET of a vertical type having a high breakdown voltage property and a high upper limit of operating frequency.

Another object of the present invention is to provide a junction FET of a vertical type described above, which has a structure exhibiting a high arrangement efficiency per unit area.

Still another object of the present invention is to provide a junction FET of a vertical type described above, which has such a unique structure as will permit a high impurity concentration of its gate regions.

A further object of the present invention is to provide a vertical type junction FET of the type and properties described above, which can be manufactured in a relatively simple process.

More particularly, the present invention intends to provide a junction FET of a vertical type having: a drain region having a first conductivity type; a gate region composed of branches formed on said drain region by a selective growth method and having a second conductivity type opposite to the first conductivity type of the drain region, at least that surface of each of the branches of the gate region which locates on the side opposite to the drain region side being covered with an insulating layer; and source regions formed by a growth of said drain region at sites located between the respective branches of the gate region.

These and other objects as well as the features and the advantages of the present invention will become apparent by reading the following detailed description with respect to the preferred examples when taken in conjunction with the accompanying drawings.

DETAILED DESCRIPTION OF THE PREFERRED EMBODIMENTS

Figure 1:
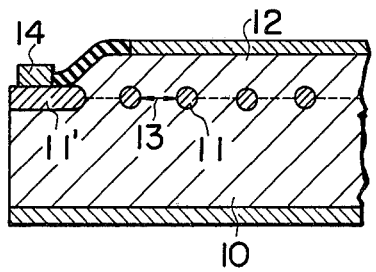
FIGS. 1 and 2 are sectional views, showing examples of the known junction FET's of vertical type, respectively.
Figure 2:
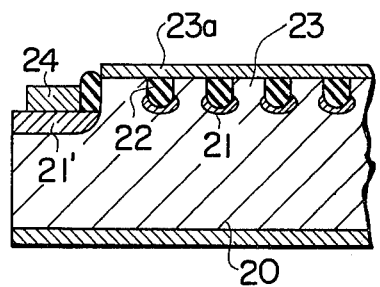
Figure 3:
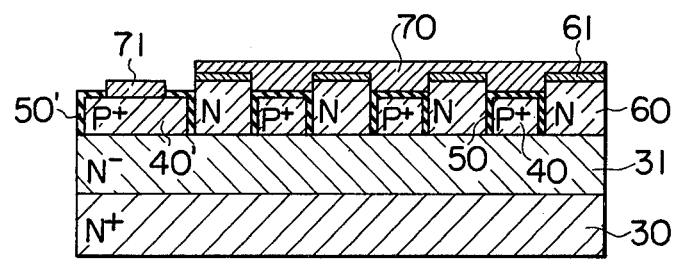
FIG. 3 is a sectional view showing an example of the junction FET of vertical type according to the present invention.

The junction FET of a vertical type shown in FIG. 3 is prepared in such a way that on top of an N+ type semiconductor substrate 30 is provided an N− type layer 31 having a low impurity concentration; on top of this N− type layer 31 are formed, by a selective growth method, branches of a gate region 40 and 40′ (the latter 40′ being appropriated for the provision of a gate electrode) of required configurations wherein the upper surfaces and desirably at least a part of the lateral surfaces of the respective gate branches 40 and 40′ are covered with insulating films 50 and 50′, respectively; and source regions 60 are provided by causing a growth of the N− type layer 31 between the respective gate branches 40 and 40′. On the surfaces of the respective source regions 60 are provided diffusion layers 61 of N+ type for ohmic contacts. A source electrode 70 is provided in such a way as to cover both the respective diffusion layers 61 of the source regions 60 and the respective insulating layers 50 of the gate branches 40. Also, a part of the insulating layer of the gate branch 40′ is removed and a gate electrode 71 is provided onto the resulting exposed site of the gate region 40′.

This junction FET of a vertical type shown in FIG. 3 is prepared, for example, by the manufacturing process including the respective steps shown in FIGS. 4 through 7.

Figure 4:
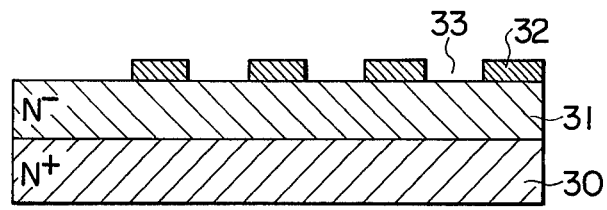
FIGS. 4 through 7 are sectional views showing an example of the manufacturing process of the junction FET of vertical type according to the present invention.

An explanation of the manufacturing process shown in FIG. 4 will be made hereunder. On the upper surface of an N+ type semiconductor substrate 30 of a high impurity concentration is caused a growth of an N− type layer 31 of a low impurity concentration; then on the entire surface of the resulting N− type layer 31 is formed an insulating layer (film) 32 of, for example, silicon nitride $Si_3N_4$; thereafter this insulating film 32 is etched into a required pattern such as mesh, lattice or honeycomb configurations having a continuous aperture 33.

Figure 5:
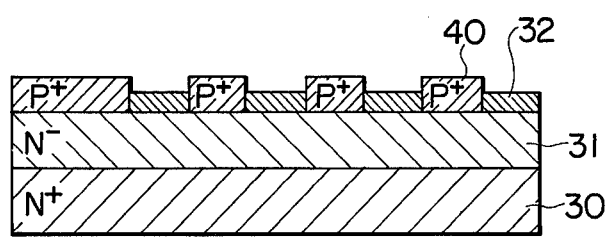

Then, as shown in FIG. 5, the resulting insulating film 32 which now has the required pattern is used as the mask. Using this mask, P-type gate regions 40 are deposited selectively on top of the substrate 31 of N− type by relying on either a vapor deposition method or a liquidous phase growth method. The dimensions of each of these deposited gate branches 40 are substantially in agreement with the dimension of the aperture of the mask. For example, the dimension of the respective gate branches 40 can be made to be 1-5 micrometers in breadth. These gate branches of P-type may be formed either by causing a selective growth of a P-type layer on the top of the N− type drain region 31 in a single step, or by first causing a selective growth of an N− type semiconductor layer on top of said drain region 31 and then diffusing a P-type impurity into the resulting N− type semiconductor layer. According to the above-stated method of forming the gate region 40 based on causing the growth of the layers as described above, there can be easily formed gate region of evenly distributed high impurity concentration. For example, the gate region 40 may have an impurity concentration of an average $10^{19}/cm^3$ or more. Furthermore, it is also possible to make this impurity concentration $10^{20}/cm^3$ or more.

Figure 6:
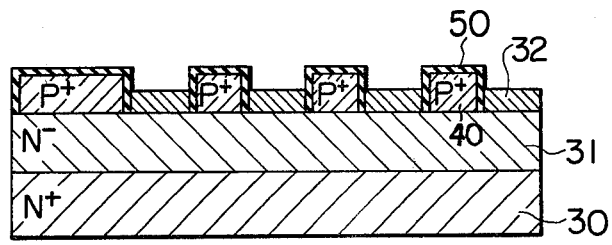

Then, as shown in FIG. 6, the peripheral portions of each of the gate branches 40 is oxidized by a thermal oxidizing method, whereby both the upper surface and substantially the entire lateral surfaces of each of these gate branches 40 are covered by an insulating film 50 which is comprised of a silicon dioxide $SiO_2$ film. The insulating film 50 has a thickness of 0.1-5 micrometers, preferably in the order of 0.5-2 micrometers. Alternatively the oxide film 50 may be formed simultaneously with the formation of the gate regions 40. Also, the insulating film 50 may be comprised of a material other than said silicon dioxide $SiO_2$. For example, the film 50 may be comprised of a silicon nitride $Si_3N_4$ or other metal oxides.

Figure 7:
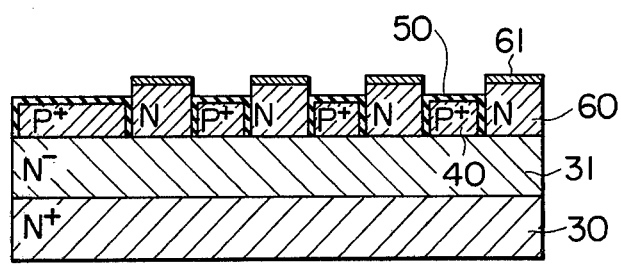

Then, as shown in FIG. 7, the insulating films 32 of $Si_3N_4$ which were initially formed on top of the N− type layer 31 are removed by etching, and crystal layers are caused to grow on top of the N− type layer 31 by a vapor deposition method to form source regions 60. Furthermore, on top of these source regions 60 are formed N+ type diffusion layers 61 for ohmic connection having a high impurity concentration.

Thereafter, as shown in FIG. 3, a source electrode 70 is formed in such a manner as to cover the diffusion layers 61 and the insulating layers 50 of the gate region 40. Furthermore, a part of the insulating film 50′ of the gate region 40′ in removed to provide a gate electrode 71.

Figure 8:
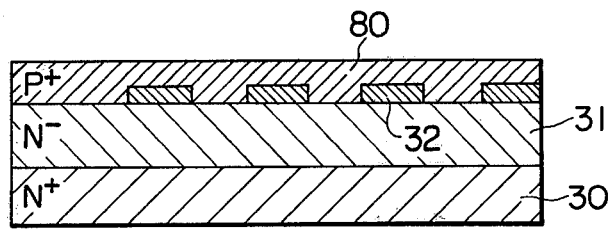
FIGS. 8 and 9 are sectional views showing a modified example of the manufacturing process according to the present invention.

The process of forming the gate region 40 which has been described above in connection with FIG. 5 may, alternatively, be performed by the following method. That is, as shown in FIG. 8, on the entire surface of the substrate 31 of N− type containing the surfaces of the respective insulating films 32 is caused to grow a crystal layer 80 of P+ conductivity type. Thereafter, those portions of this crystal layer 80 located on the insulating films 32 are removed to form gate region 40 as shown in FIG. 5. In such an instance, those portions of the crystal layer 80 located on the respective insulating films 32 are provided in the form of a polycrystal structure which, by nature, is easy to etch. Therefore, these portions of the crystal layer 80 can be relatively easily removed.

Figure 9:
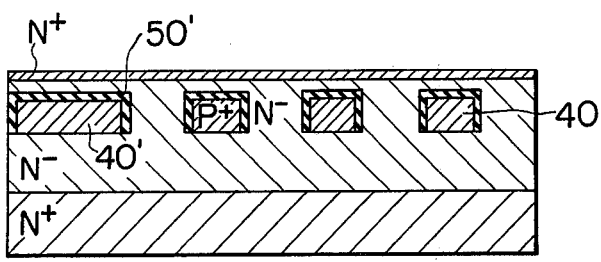

The source regions 60, especially when it is intended to form source regions by the use of a polycrystalline semiconductor material, may be formed so as to cover the entire area including the upper surfaces of the gate branches 40 as shown in FIG. 9, in place of causing a growth of the N⁻ type substrate 31 between the respective gate branches 40 as shown in FIG. 7. In such an instance, the gate electrode is provided after removing, by etching, a part of those portions of the N-type semiconductor bulks located on the gate branch 40' and the corresponding part of the insulating layer 50'.

Description has been made with respect to the manufacture of examples of an N-channel type semiconductor device according to the present invention wherein the semiconductors which constitute the drain regions and the source regions are of the N⁻ conductivity type. It will be understood easily, however, by those skilled in the art that a P-channel type semiconductor device may be equally easily manufactured by merely replacing the N-type constituent semiconductors by P-type semiconductor materials and vice versa.

As stated above, according to the present invention, the gate region 40 is formed by relying on the growth technique. Therefore, the dimensions of the respective gate branches are in agreement with the dimension of the aperture of the mask. Thus, it is possible to select the precise gate width as well as the channel width between the respective grids.

Also, the impurity concentration of the gate region is determined and set independently of the dimensions of the gate grids. Besides, owing to the insulating films 50 which substantially cover the respective gate branches 40, there is given no adverse effect on the formation of the source regions. Thus, the impurity concentration of the gate region can be made so as to be considerably high. Whereby, the series resistance at the gate branches can be set at a low level. Thus, an improvement of the high frequency characteristic of the FET of a vertical type can be attained. Besides, the gate region and the source regions are separated and isolated perfectly and sufficiently from each other by the insulating layers provided. Accordingly, a good gate-to-source breakdown voltage property of the FET of a vertical type can be obtained.

Furthermore, according to the method of manufacture of the junction FET of a vertical type of the present invention, the principal steps of manufacture comprise the formation of oxide film which is conducted twice and the selective growth which is also conducted twice, until the gate region and the source regions are formed, and in addition thereto, the masking step is conducted in only three to four steps. Thus, as compared with the known process of manufacture of semiconductor devices, the process according to the present invention is greatly simplified and, for this reason, the yield is increased.

We claim:
1. A junction field effect transistor of a vertical type comprising:
    a drain region having a first conductivity type;
    a gate region having a second conductivity type opposite to said first type, said gate region including spaced branches formed by a selective growth method on a top surface of the drain region to define top and side surfaces of the branches;
    an insulating layer covering the top surfaces and at least a portion of the side surfaces of said branches; and
    source regions formed by a growth of the drain region on those portions on the top surface of the drain region not covered by the spaced branches and said insulating layer.

2. A junction field effect transistor of a vertical type according to claim 1, in which the gate region has an impurity concentration of at least $10^{19}/cm^3$.

3. A junction field effect transistor of a vertical type according to claim 1, in which said insulating layer comprises a heated and oxidized portion of the gate region.

4. A junction field effect transistor of a vertical type according to claim 1, in which the insulating layer comprises silicon dioxide.

5. A junction field effect transistor of a vertical type according to claim 1, in which the insulating layer comprises silicon nitride.

6. A junction field effect transistor of a vertical type according to claim 1, in which the insulating layer comprises a metal oxide.

* * * * *